(12) United States Patent
Mei et al.

(10) Patent No.: US 12,336,424 B2
(45) Date of Patent: Jun. 17, 2025

(54) LIGHT EMITTING PANEL, DISPLAY APPARATUS, AND MANUFACTURING METHOD OF LIGHT EMITTING PANEL

(71) Applicant: BOE Technology Group Co., Ltd., Beijing (CN)

(72) Inventors: Wenhai Mei, Beijing (CN); Yichi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 861 days.

(21) Appl. No.: 17/402,112

(22) Filed: Aug. 13, 2021

(65) Prior Publication Data
US 2022/0102661 A1   Mar. 31, 2022

(30) Foreign Application Priority Data

Sep. 25, 2020   (CN) .......................... 202011024920.9

(51) Int. Cl.
| | |
|---|---|
| H01L 51/50 | (2006.01) |
| H10K 50/11 | (2023.01) |
| H10K 50/16 | (2023.01) |
| H10K 50/17 | (2023.01) |
| H10K 71/00 | (2023.01) |

(Continued)

(52) U.S. Cl.
CPC ........... *H10K 85/615* (2023.02); *H10K 50/11* (2023.02); *H10K 50/16* (2023.02); *H10K 50/17* (2023.02); *H10K 50/171* (2023.02); *H10K 71/00* (2023.02); *H10K 71/15* (2023.02); *H10K 2101/40* (2023.02)

(58) Field of Classification Search
None
See application file for complete search history.

(56) References Cited

U.S. PATENT DOCUMENTS

| | | | |
|---|---|---|---|
| 2013/0074920 A1 | 3/2013 | Echegoyen et al. | |
| 2015/0218185 A1* | 8/2015 | Takimiya ............. | C07D 495/22 549/41 |

FOREIGN PATENT DOCUMENTS

CN   110911580 A   3/2020

OTHER PUBLICATIONS

Zabel et. al., Engineering of gold surface work function by electrodeposition of spirobifluorene donor-acceptor bipolar systems; Organic Electronics 10 (2009) 1307-1313 (Year: 2009).*

(Continued)

*Primary Examiner* — Gregory D Clark
(74) *Attorney, Agent, or Firm* — IPro, PLLC

(57) ABSTRACT

Disclosed are a light emitting panel, a display apparatus, and a method for manufacturing the light emitting panel. The light emitting panel includes: a substrate, at least two electrode layers arranged on one side of the substrate, a light emitting layer between the electrode layers. An interfacial modification layer is arranged on one side of at least one of the electrode layers facing the light emitting layer. The interfacial modification layer includes: a polycyclic structure, a first electriferous group connected to a side of the polycyclic structure away from the light emitting layer, a second electriferous group connected to a side of the polycyclic structure facing the light emitting layer. Charges of the first and second electriferous group are different, so that the interfacial modification layer has a dipole moment, therefore a work function of the electrode layers in contact with the interfacial modification layer is adjusted.

14 Claims, 5 Drawing Sheets

(51) Int. Cl.
 *H10K 71/15* (2023.01)
 *H10K 85/60* (2023.01)
 *H10K 101/40* (2023.01)

(56) References Cited

OTHER PUBLICATIONS

CN202011024920.9 first office action.

* cited by examiner

LIGHT EMITTING PANEL, DISPLAY APPARATUS, AND MANUFACTURING METHOD OF LIGHT EMITTING PANEL

CROSS-REFERENCE TO RELATED APPLICATION

This application is based on and claims priority under 35 U.S.C 119 to Chinese Patent Application No. 202011024920.9, filed on Sep. 25, 2020, in the China National Intellectual Property Administration. The entire disclosure of the above application is incorporated herein by reference.

FIELD

The present disclosure relates to the technical field of display, in particular to a light emitting panel, a display apparatus, and a manufacturing method of the light emitting panel.

BACKGROUND

An organic light emitting diode (OLED) display has the advantages of low energy consumption, self-illumination, wide viewing angle and fast response speed, which is one of the hotspots in the field of display research.

A quantum dots light emitting diode (QLED) display is a novel display technology developed based on an organic light emitting display. The difference between the two is that a light-emitting layer in the QLED is a quantum dot layer, of which the principle is that electrons/holes are injected into the quantum dot layer through an electron/hole transport layer, and the electrons and the holes emit light in the quantum dot layer in a compound mode. Compared with the OLED, the QLED has the advantages of narrow luminous peak, high color saturation and wide color gamut.

SUMMARY

An embodiment of the present disclosure provides a light emitting panel, including: a substrate, at least two electrode layers arranged on one side of the substrate, and a light emitting layer arranged between the two electrode layers.

An interfacial modification layer is arranged on one side of at least one of the electrode layers facing the light emitting layer; the interfacial modification layer includes a polycyclic structure, a first electriferous group connected to a side of the polycyclic structure facing away from the light emitting layer, and a second electriferous group connected to a side of the polycyclic structure facing the light emitting layer; and charges of the first electriferous group and the second electriferous group are different, so that the interfacial modification layer has a dipole moment, and therefore a work function of the electrode layers in contact with the interfacial modification layer is adjusted.

In one possible implementation, each of the electrode layers includes a cathode layer, the interfacial modification layer is arranged on a side of the cathode layer facing the light emitting layer, and an electron transfer layer is arranged between the interfacial modification layer and the light emitting layer;

in response to a work function of the cathode layer being higher than an LUMO energy level of the electron transfer layer, and an absolute value of a difference between the work function of the cathode layer and the LUMO energy level of the electron transfer layers being greater than a first threshold value, the interfacial modification layer is configured to decrease the work function of the cathode layer, the first electriferous group is an electronegative group, and the second electriferous group is an electropositive group; or in response to a work function of the cathode layer being lower than the LUMO energy level of the electron transfer layer, and an absolute value of the difference between the work function of the cathode layer and the LUMO energy level of the electron transfer layer being greater than a second threshold value, the interfacial modification layer is configured to increase the work function of the cathode layer, the first electriferous group is an electropositive group, and the second electriferous group is an electronegative group.

In one possible implementation, each of the electrode layers includes an anode layer, the interfacial modification layer is arranged on a side of the anode layer facing the light emitting layer, and a hole injection layer is arranged between the interfacial modification layer and the light emitting layer;

in response to a work function of the anode layer being higher than an HOMO energy level of the hole injection layer, and an absolute value of a difference between the work function of the anode layer and the HOMO energy level of the hole injection layers being greater than a third threshold value, the interfacial modification layer is configured to decrease the work function of the anode layer, the first electriferous group is an electronegative group, and the second electriferous group is an electropositive group; or in response to a work function of the anode layer being lower than the HOMO energy level of the hole injection layer, and an absolute value of the difference between the work function of the anode layer and the HOMO energy level of the hole injection layer being greater than a fourth threshold value, the interfacial modification layer is configured to increase the work function of the anode layer, the first electriferous group is an electropositive group, and the second electriferous group is an electronegative group.

In one possible implementation, the polycyclic structure has a first symmetry axis and a second symmetry axis, a length of the polycyclic structure along a first symmetry axis direction is less than a length of the polycyclic structure along a second symmetry axis direction, and the first electriferous group and the second electriferous group are respectively arranged on different sides of the first symmetry axis; or the polycyclic structure only has a third symmetry axis, and the first electriferous group and the second electriferous group are respectively arranged on different sides of the third symmetry axis.

In one possible implementation, a material of the electron transfer layer is a metallic oxide, and the second electriferous group is a hydrophilic group; or a material of the hole injection layer is a metallic oxide, and the second electriferous group is a hydrophilic group.

In one possible implementation, a material of the electrode layer in contact with the interfacial modification layer is a transparent conductive oxide film, and the first electriferous group is a hydrophilic group.

In one possible implementation, the first electriferous group includes a group obtained after a phenolic hydroxyl group or a carboxyl group reacts with a basic group.

In one possible implementation, the second electriferous group includes a group obtained after an amino group reacts with an acidic group.

In one possible implementation, the second electriferous group further includes carbon atoms connecting the polycyclic structure and the second electriferous group, and an R group connected with nitrogen atoms; and the R group is one or a combination of followings:
hydrogen atoms,
a methyl group, and
an alkyl group.

In one possible implementation, the polycyclic structure is a polycyclic aromatic hydrocarbon including a single benzene ring or a plurality of benzene rings.

In one possible implementation, the polycyclic structure is one of followings:

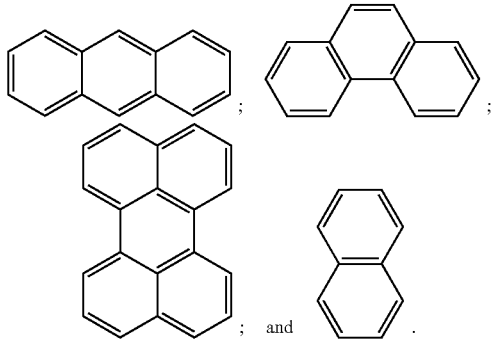

In one possible implementation, the interfacial modification layer includes a following structure:

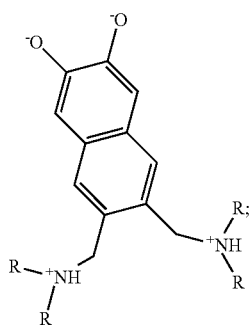

wherein an R group is one or a combination of followings:
hydrogen atoms,
a methyl group, and
an alkyl group.

An embodiment of the present disclosure further provides a display apparatus, including the light emitting panel provided by embodiments of the present disclosure.

An embodiment of the present disclosure further provides a manufacturing method of the light emitting panel provided by embodiments of the present disclosure, including:
forming an electrode layer on one side of a substrate;
forming an interfacial modification layer on one side of the electrode layer facing away from the substrate;
forming a light emitting layer on one side of the interfacial modification layer facing away from the electrode layer; and
forming another electrode layer on one side of the light emitting layer facing away from the interfacial modification layer.

In one possible implementation, forming the interfacial modification layer on the side of the electrode layer facing away from the substrate includes:
dissolving an interfacial modification material in a solvent and mixing with an electron transfer layer material to form a mixed solution; and
dripping the mixed solution on a surface of the side of the electrode layer facing away from the substrate, and performing spin-coating so as to make the interfacial modification material self-assembled to a surface of an electrode through the action of hydrogen bonds.

In one possible implementation, the forming the interfacial modification layer on the side of the electrode layer facing away from the substrate includes:
dissolving an interfacial modification material in a solvent; and
forming the interfacial modification material on the side of the electrode layer facing away from the substrate in a soaking or a spin-coating mode, so as to make the interfacial modification material self-assembled to a surface of an electrode through the action of hydrogen bonds.

DETAILED DESCRIPTION OF THE EMBODIMENTS

In order to make objectives, technical solutions and advantages of embodiments of the present disclosure clearer, the technical solutions of the embodiments of the present disclosure will be clearly and fully described below in combination with the accompanying drawings of the embodiments of the present disclosure. Obviously, the described embodiments are some, but not all of the embodiments of the present disclosure. On the basis of the described embodiments of the present disclosure, all other embodiments obtained by those ordinarily skilled in the art without creative work belong to the protection scope of the present disclosure.

Unless otherwise defined, technical or scientific terms used in the present disclosure should be understood commonly by those ordinarily skilled in the art of the present disclosure. "First", "second" and other similar words used in the present disclosure do not denote any sequence, quantity or significance, but are only configured to distinguish different components. "Include", or "contain" and other similar words mean that components or items preceding the words cover components or items and their equivalents listed after the words without excluding other components or items. "Connection" or "joint" and other similar words are not limited to physical or mechanical connection but also include electrical connection in spite of being direct or indirect. "Upper", "lower", "left", "right" and the like are only configured to represent a relative position relationship, and when an absolute position of a described object changes, the relative position relationship may also change accordingly.

In order to keep the following description of the embodiments of the present disclosure clear and concise, the present disclosure omits a detailed description of known functions and known components.

Figure 1:
FIG. 1 is a schematic structural diagram of a light emitting panel provided by an embodiment of the present disclosure.
Figure 2:
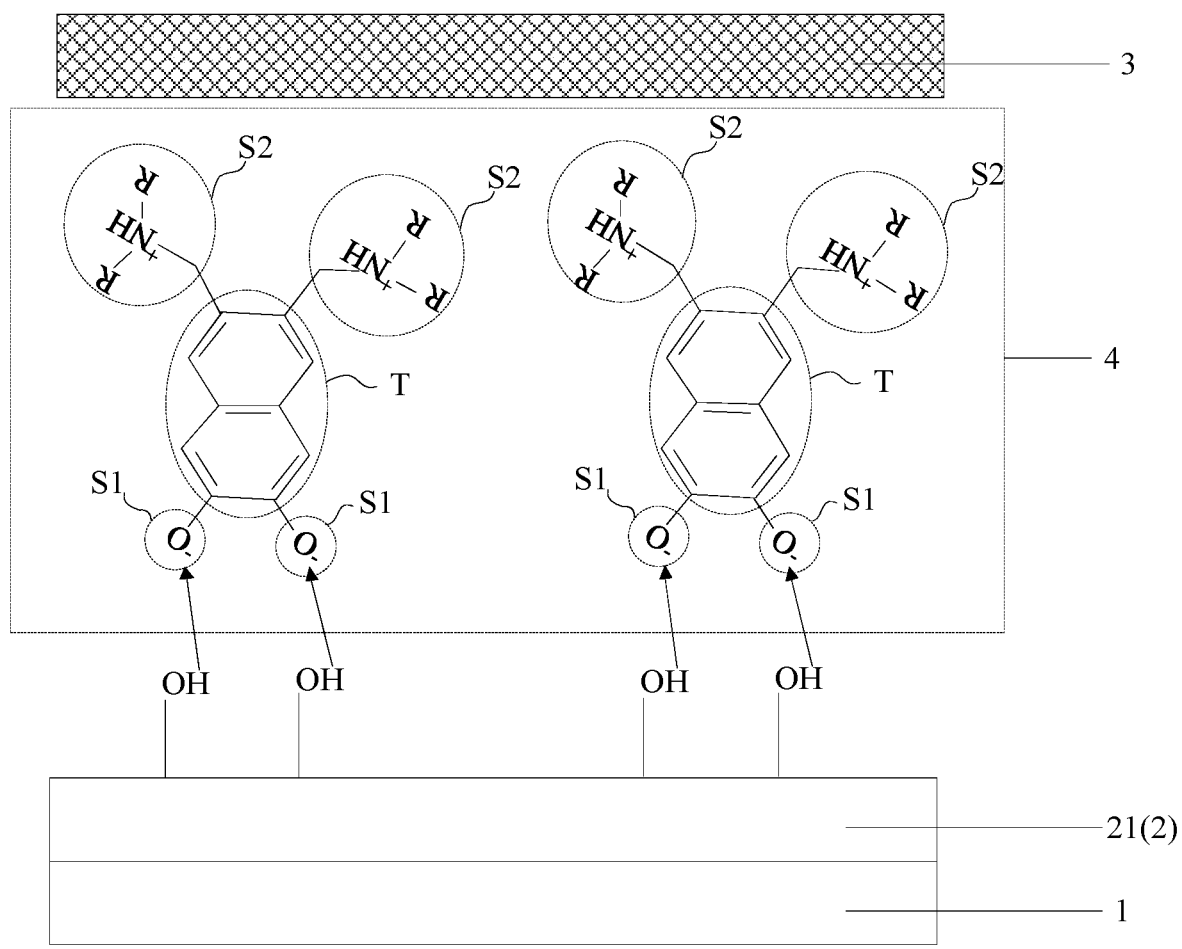
FIG. 2 is a partial schematic structural diagram of a light emitting panel provided by an embodiment of the present disclosure.

An embodiment of the present disclosure provides a light emitting panel, as shown in FIG. 1 and FIG. 2, including: a substrate 1, at least two electrode layers 2 arranged on one side of the substrate 1, and a light emitting layer 3 arranged between the two electrode layers 2.

Figure 3:
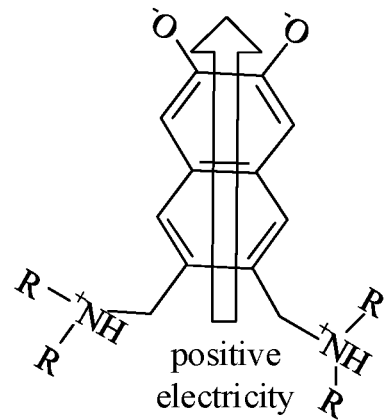
FIG. 3 is a schematic structural diagram of an interfacial modification layer material provided by an embodiment of the present disclosure.

An interfacial modification layer 4 is arranged on one side of at least one of the electrode layers 2 facing the light emitting layer 3; the interfacial modification layer 4 includes: a polycyclic structure T, a first electriferous group S1 connected to a side of the polycyclic structure T facing away from a light emitting layer 5, and a second electriferous group S2 connected to a side of the polycyclic structure T facing the light emitting layer 5; and charges of the first electriferous group S1 and the second electriferous group S2 are different, so that the interfacial modification layer 4 has a dipole moment (as shown in FIG. 3), and therefore a work function of the electrode layers 2 in contact with the interfacial modification layer 4 is adjusted. For example, as shown in FIG. 1 and FIG. 2, the electrode layers 2 include a first electrode layer 21 arranged on one side of the substrate 1, and a second electrode layer 22 arranged on one side of the first electrode layer 21 facing away from the substrate 1. According to the light emitting panel, specifically, the interfacial modification layer 4 is arranged between the first electrode layer 21 and the light emitting layer 3 so as to achieve adjustment of a work function of the first electrode layer 21.

In some embodiments of the present disclosure, the interfacial modification layer 4 is arranged on the side of at least one of the electrode layers 2 facing the light emitting layer 3; the interfacial modification layer 4 includes: the polycyclic structure T, the first electriferous group S1 connected to the side of the polycyclic structure T facing away from the light emitting layer 5, and the second electriferous group S2 connected to the side of the polycyclic structure T facing the light emitting layer 5; and the charges of the first electriferous group S1 and the second electriferous group S2 are different, so that the interfacial modification layer 4 has the dipole moment (i.e., intrinsic dipole moment), as shown in FIG. 3, and the work function of the electrode layers 2 in contact with the interfacial modification layer 4 is adjusted. Therefore, the number of carriers injected into the electrode layers 2 may be adjusted so as to solve the problem of unbalanced carrier injection that exists in a light emitting device in the prior art.

In some embodiments, the light emitting panel may be an organic light emitting display panel, and the corresponding light emitting layer 3 may be an organic light emitting layer; and the light emitting panel may also be a quantum dots light emitting display panel, and the corresponding light emitting layer 3 may be a quantum dots light emitting layer. Function layers 5 may also be arranged between the electrode layers 2 and the light emitting layer 3. Optionally, as shown in FIG. 1, for example, the first electrode layer 21 is a cathode layer, the second electrode layer 22 is an anode layer, the function layer 5 that may be arranged between the first electrode layer 21 and the light emitting layer 3 is an electron transfer layer 51, and the interfacial modification layer 4 may be specifically arranged between the cathode layer and the electron transfer layer 51 so as to adjust a work function of the cathode layer. The function layer 5 that may be arranged between the anode layer and the light emitting layer 3 is a hole transfer layer 53, and the function layer 5 that may be arranged between the hole transfer layer 53 and the anode layer is a hole injection layer 52. In some embodiments, the interfacial modification layer 4 may also be arranged between the anode layer and the hole injection layer 52 so as to adjust a work function of the anode layer.

In some embodiments, as shown in FIG. 1 and FIG. 2, the function layers 5 (for example, the electron transfer layer 51) may also be arranged between the electrode layers 2 (for example, the cathode layer, that is, the first electrode layer 21) and the light emitting layer 3, and the interfacial modification layer 4 may be arranged between the cathode layer and the electron transfer layer 51. When the work function of the electrode layers 2 (for example, the cathode layer) is higher than a LUMO energy level of the function layers 5, and an absolute value of a difference between the work function of the cathode layer and a LUMO energy level of the electron transfer layer is greater than a first threshold value, the interfacial modification layer 4 is configured to decrease the work function of the electrode layers 2 (that is, the cathode layer) in contact with the interfacial modification layer 4, the first electriferous group S1 is an electronegative group, and the second electriferous group S2 is an electropositive group. In some embodiments of the present disclosure, the function layers 5 (for example, the electron transfer layer 51) may also be arranged between the electrode layers 2 (for example, the cathode layer) and the light emitting layer 3. When the work function of the electrode layers 2 (for example, the cathode layer) is higher than the LUMO energy level of the function layers 5, the first group S1 is electronegative, so that the work function of the electrode layers 2 (that is, the cathode layer) is decreased, and electrons are injected more easily.

In some embodiments, the function layers 5 (for example, the electron transfer layer 51) may also be arranged between the electrode layers 2 (for example, the cathode layer) and the light emitting layer 3. When the work function of the electrode layers 2 (for example, the cathode layer) is lower than the LUMO energy level of the function layers 5 (for example, the electron transfer layer 51), and an absolute value of a difference between the work function of the cathode layer and the LUMO energy level of the electron transfer layer is greater than a second threshold value, the interfacial modification layer 4 is configured to increase the work function of the electrode layers 2 (that is, the cathode layer) in contact with the interfacial modification layer 4, the first electriferous group S1 is an electropositive group, and the second electriferous group S2 is an electronegative group. In some embodiments of the present disclosure, the function layers 5 (for example, the electron transfer layer 51) may also be arranged between the electrode layers 2 (for example, the cathode layer) and the light emitting layer 3, and when the work function of the electrode layers 2 (for example, the cathode layer) is lower than the LUMO energy level of the function layers 5, the first group S1 is electropositive, so that the work function of the electrode layers 2 (for example, the cathode layer) is increased, and electrons are injected more easily.

In some embodiments, the function layers 5 (for example, the hole injection layer 52) may also be arranged between the electrode layers 2 (for example, the anode layer, that is, the second electrode layer 22) and the light emitting layer 3. When the work function of the electrode layers 2 (for example, the anode layer) is higher than the LUMO energy level of the function layers 5 (for example, the hole injection layer 52), and an absolute value of a difference between the work function of the anode layer and a HOMO energy level of the hole injection layer is greater than a third threshold value, the interfacial modification layer 4 is configured to decrease the work function of the electrode layers 2 (that is, the anode layer) in contact with the interfacial modification layer 4, the first electriferous group S1 is an electronegative group, and the second electriferous group S2 is an electropositive group; or when the work function of the electrode layers 2 (for example, the anode layer) is lower than the LUMO energy level of the function layers 5 (for example, the hole injection layer 52), and the absolute value of the difference between the work function of the anode layer and the HOMO energy level of the hole injection layer is greater than a fourth threshold value, the interfacial modification layer 4 is configured to increase the work function of the electrode layers 2 (that is, the anode layer) in contact with the interfacial modification layer 4, the first electriferous group S1 is an electropositive group, and the second electriferous group S2 is an electronegative group.

Optionally, a higher or lower relationship between the work function of the electrode layers 2 and the energy level of the function layers 5 may be determined according to a specific material of the electrode layers 2 and a specific material of the function layers 5 adopted in some embodiments.

Figure 4:
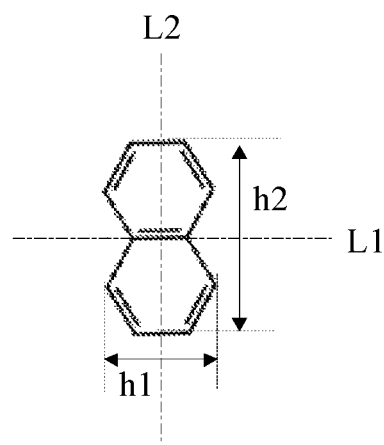
FIG. 4 is a schematic structural diagram of an interfacial modification layer material provided by an embodiment of the present disclosure.
Figure 5:
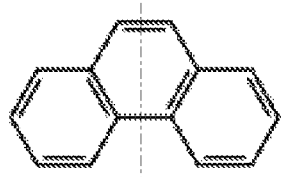
FIG. 5 is a schematic structural diagram of another interfacial modification layer material provided by an embodiment of the present disclosure.

In some embodiments, the polycyclic structure T has a first symmetry axis L1 and a second symmetry axis L2, a length of the polycyclic structure T along a direction of the first symmetry axis L1 is less than a length of the polycyclic structure T along a direction of the second symmetry axis L2, and the first electriferous group S1 and the second electriferous group S2 are respectively arranged on different sides of the first symmetry axis L1; or the polycyclic structure T only has a third symmetry axis L3, and the first electriferous group S1 and the second electriferous group S2 are respectively arranged on different sides of the third symmetry axis L3. Optionally, for example, the polycyclic structure T is a structure shown in FIG. 4 and has the first symmetry axis L1 and the second symmetry axis L2. The length h1 of the polycyclic structure T along the direction of the first symmetry axis L1 is less than the length h2 of the polycyclic structure T along the direction of the second symmetry axis L2. As shown in FIG. 2, the first electriferous group S1 and the second electriferous group S2 are respectively arranged on different sides of the first symmetry axis L1. For example, the first electriferous group S1 is arranged at a lower side of the first symmetry axis L1, and the second electriferous group S2 is arranged at an upper side of the first symmetry axis L1. Or, optionally, for example, the polycyclic structure T is a structure shown in FIG. 5 and only has the third symmetry axis L3, and the first electriferous group S1 and the second electriferous group S2 are respectively arranged on different sides of the third symmetry axis L3. For example, the first electriferous group S1 is arranged at a left side of the third symmetry axis L3, and the second electriferous group S2 is arranged at a right side of the third symmetry axis L3.

In some embodiments, as shown in FIG. 1 and FIG. 2, a material of the function layers 5 is a metallic oxide, and the second electriferous group S2 is a hydrophilic group. For example, the metallic oxide may be zinc oxide or nickel oxide. Optionally, for example, a material of the electron transfer layer is the metallic oxide, for example, the zinc oxide, and the second electriferous group S2 is the hydrophilic group; or a material of the hole injection layer is a metallic oxide, for example, the nickel oxide, and the second electriferous group S2 is the hydrophilic group. Optionally, for example, the first electrode layer 21 is the cathode layer, the second electrode layer 22 is the anode layer, a material of the electron transfer layer 51 between the first electrode layer 21 and the light emitting layer 3 is the zinc oxide, and the second electriferous group S2 is the hydrophilic group, so that the interfacial modification layer 4 has a strong force with the electron transfer layer 51 made of the zinc oxide, which is conducive to spin coating film-forming of the electron transfer layer 51.

In some embodiments, as shown in FIG. 1 and FIG. 2, a material of the electrode layers 2 in contact with the interfacial modification layer 4 is a transparent conductive oxide film, and the first electriferous group S1 is a hydrophilic group. Optionally, the transparent conductive oxide film may be indium tin oxide (ITO). In some embodiments of the present disclosure, the material of the electrode layers 2 in contact with the interfacial modification layer 4 is the transparent conductive oxide film, and the first electriferous group S1 is the hydrophilic group, so that the first electriferous group S1 may form hydrogen bonds with a hydroxyl group on surfaces of the electrode layers 2, which plays a role of anchoring on the surfaces of the electrode layers 2, and modify the electrode layers.

In some embodiments, the first electriferous group S1 includes a group obtained after a phenolic hydroxyl group or a carboxyl group reacts with a basic group. For example, as shown in FIG. 6, a left side is a material of the interfacial modification layer 4 before salifying, a right side is a material of the interfacial modification layer 4 after salifying, and a group S10 of the first electriferous group S1 before salifying includes the phenolic hydroxyl group.

In some embodiments, the second electriferous group S2 includes a group obtained after an amino group reacts with an acidic group. For example, as shown in FIG. 6, a left side is the material of the interfacial modification layer 4 before salifying, a right side is the material of the interfacial modification layer 4 after salifying, and a group S20 of the second electriferous group S2 before salifying includes the amino group.

Figure 6:
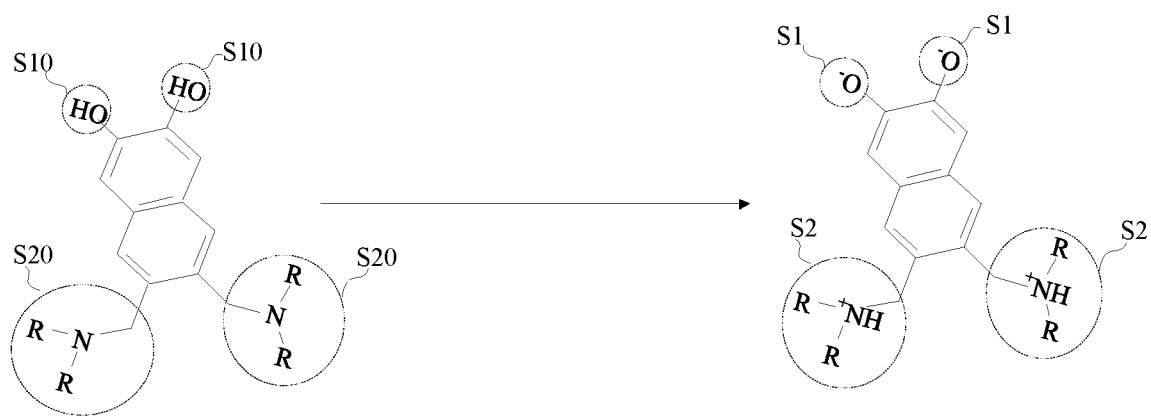
FIG. 6 is a schematic structural diagram of an interfacial modification layer material before and after salifying provided by an embodiment of the present disclosure.

In some embodiments, as shown in FIG. 6, the second electriferous group S2 further includes: carbon atoms connecting the polycyclic structure T and the second electriferous group S2, and an R group connected with nitrogen atoms. Optionally, the R group is one or a combination of the followings:
  hydrogen atoms,
  a methyl group, and
  an alkyl group.

In some embodiments, the polycyclic structure T is a polycyclic aromatic hydrocarbon including a single benzene ring or a plurality of benzene rings. Optionally, the polycyclic structure is one of the followings:

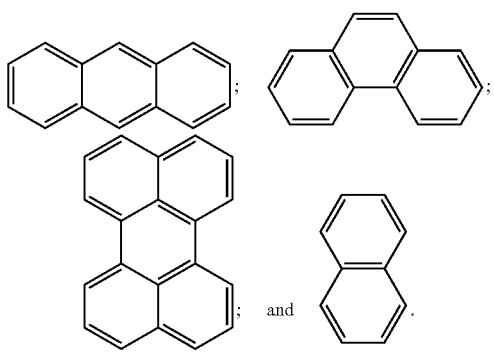

In some embodiments, the interfacial modification layer 4 includes a following structure:

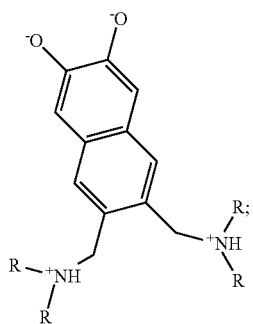

and optionally, an R group is one or the combination of the followings:
- hydrogen atoms,
- a methyl group, and
- an alkyl group.

An embodiment of the present disclosure further provides a display apparatus, including the light emitting panel provided by the embodiment of the present disclosure.

Figure 7:
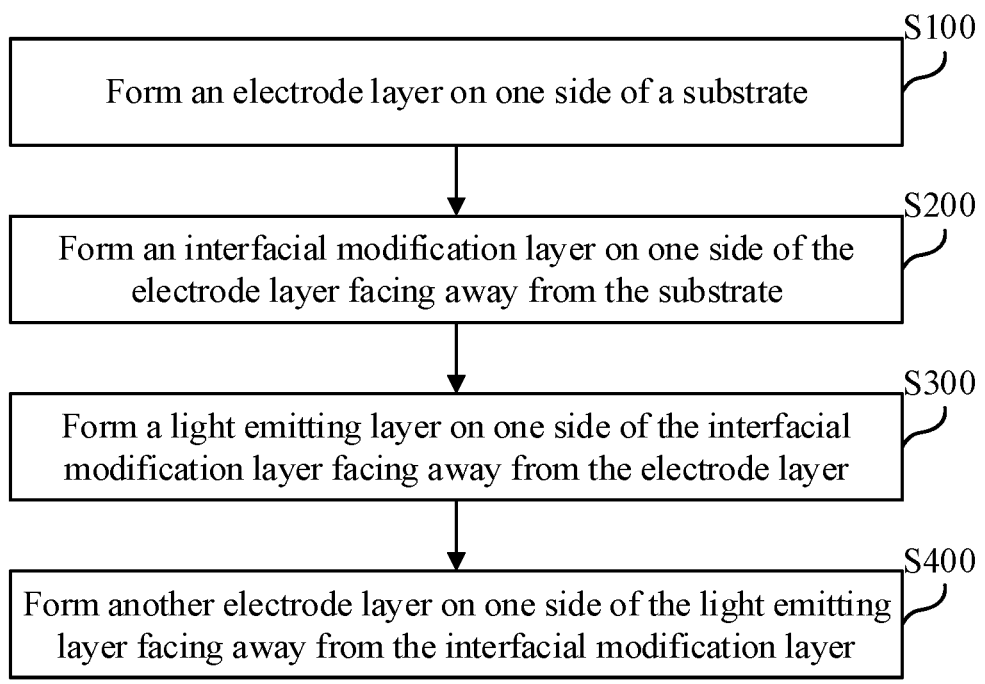
FIG. 7 is a manufacturing flow diagram of a light emitting panel provided by an embodiment of the present disclosure.

An embodiment of the present disclosure further provides a manufacturing method of the light emitting panel provided by the embodiment of the present disclosure, as shown in FIG. 7, including:
- step S100, an electrode layer is formed on one side of a substrate;
- step S200, an interfacial modification layer is formed on one side of the electrode layer facing away from the substrate;
- step S300, a light emitting layer is formed on one side of the interfacial modification layer facing away from the electrode layer; and
- step S400, another electrode layer is formed on one side of the light emitting layer facing away from the interfacial modification layer.

Optionally, in step S200, the interfacial modification layer is formed on the side of the electrode layer facing away from the substrate, including:
- step S210, an interfacial modification material is dissolved in a solvent and mixing is conducted with an electron transfer layer material to form a mixed solution, wherein the specific solvent may be an alcohol solvent, an ester-interior solvent or an aprotic polar solvent; and
- step S220, the mixed solution is dripped on a surface of the side of the electrode layer facing away from the substrate, and spin-coating is conducted so as to make the interfacial modification material self-assembled to a surface of an electrode through the action of hydrogen bonds.

Optionally, a cathode adopts ITO, the interfacial modification layer material adopts molecules A, the interfacial modification layer material A may be dissolved in the alcohol solvent, the interfacial modification layer material and zinc oxide nanoparticles are dissolved in isopropanol to form a solution, a concentration of the interfacial modification material may be 1 mg/ml and a concentration of zinc oxide may be 30 mg/ml, and the interfacial modification material and the zinc oxide are mixed to form the mixed solution; the mixed solution is dripped on the ITO, standing is conducted for 5 minutes, spin coating is conducted at 1500 rpm, annealing is conducted at 120° C. for 20 min, spin coating of a quantum dots light emitting layer is conducted for 45 s at a rotating speed of 2500 rpm, and annealing is conducted at 80° C.; and a hole transfer layer, a hole injection layer and an anode material are evaporated in turn to prepare a complete quantum dots light emitting diode (QLED) device.

Optionally, in step S200, the interfacial modification layer is formed on the side of the electrode layer facing away from the substrate, including:
- step S230, the interfacial modification material is dissolved in the solvent, wherein the specific solvent may be the alcohol solvent, the ester-interior solvent or the aprotic polar solvent; and
- step S240, the interfacial modification material is formed on the side of the electrode layer facing away from the substrate in a soaking or a spin-coating mode, so as to make the interfacial modification material self-assembled to the surface of the electrode through the action of the hydrogen bonds. For example, the substrate with the electrode layer may be soaked in the alcohol solvent with the interfacial modification material dissolved.

Embodiments of the present disclosure have the beneficial effects: in some embodiments of the present disclosure, the interfacial modification layer is arranged on the side of at least one of the electrode layers facing the light emitting layer; the interfacial modification layer includes: the polycyclic structure, the first electriferous group connected to the side of the polycyclic structure facing away from the light emitting layer, and the second electriferous group connected to the side of the polycyclic structure facing the light emitting layer; and the charges of the first electriferous group and the second electriferous group are different, so that the interfacial modification layer has the dipole moment, and the work function of the electrode layers in contact with the interfacial modification layer is adjusted. Therefore, the number of carriers injected into the electrode layers may be adjusted so as to solve the problem of unbalanced carrier injection that exists in the light emitting device in the prior art.

Obviously, those skilled in the art can make various variations and modifications to the disclosure without departing from the spirit and scope of the disclosure. Therefore, if these modifications and variations of the disclosure fall within the scope of the claims of the disclosure and its equivalent technology, the disclosure is also intended to include these modifications and variations.

What is claimed is:

1. A light emitting panel, comprising: a substrate, at least two electrode layers arranged on one side of the substrate, and a light emitting layer arranged between the two electrode layers; wherein
    an interfacial modification layer is arranged on one side of at least one of the electrode layers facing the light emitting layer; the interfacial modification layer comprises a polycyclic structure, a first electriferous group connected to a side of the polycyclic structure facing away from the light emitting layer, and a second electriferous group connected to a side of the polycyclic structure facing the light emitting layer; and charges of the first electriferous group and the second electriferous group are different, so that the interfacial modification layer has a dipole moment, and therefore a work function of the electrode layers in contact with the interfacial modification layer is adjusted;
    wherein each of the electrode layers comprises a cathode layer, the interfacial modification layer is arranged on a side of the cathode layer facing the light emitting layer, and an electron transfer layer is arranged between the interfacial modification layer and the light emitting layer;
    in response to a work function of the cathode layer being higher than an LUMO energy level of the electron transfer layer, and an absolute value of a difference between the work function of the cathode layer and the LUMO energy level of the electron transfer layer being greater than a first threshold value, the interfacial modification layer is configured to decrease the work function of the cathode layer, the first electriferous group is an electronegative group, and the second electriferous group is an electropositive group;
    or
    each of the electrode layers comprises an anode layer, the interfacial modification layer is arranged on a side of the anode layer facing the light emitting layer, and a hole injection layer is arranged between the interfacial modification layer and the light emitting layer;
    in response to a work function of the anode layer being higher than an HOMO energy level of the hole injection layer, and an absolute value of a difference between the work function of the anode layer and the HOMO energy level of the hole injection layer being greater than a third threshold value, the interfacial modification layer is configured to decrease the work function of the anode layer, the first electriferous group is an electronegative group, and the second electriferous group is an electropositive group.

2. The light emitting panel according to claim 1, wherein the polycyclic structure has a first symmetry axis and a second symmetry axis, a length of the polycyclic structure along a first symmetry axis direction is less than a length of the polycyclic structure along a second symmetry axis direction, and the first electriferous group and the second electriferous group are respectively arranged on different sides of the first symmetry axis; or
    the polycyclic structure only has a third symmetry axis, and the first electriferous group and the second electriferous group are respectively arranged on different sides of the third symmetry axis.

3. The light emitting panel according to claim 1, wherein a material of the electron transfer layer is a metallic oxide, and the second electriferous group is a hydrophilic group; or a material of the hole injection layer is a metallic oxide, and the second electriferous group is a hydrophilic group.

4. The light emitting panel according to claim 1, wherein a material of the electrode layer in contact with the interfacial modification layer is a transparent conductive oxide film, and the first electriferous group is a hydrophilic group.

5. The light emitting panel according to claim 1, wherein the first electriferous group comprises a group obtained after a phenolic hydroxyl group or a carboxyl group reacts with a basic group.

6. The light emitting panel according to claim 1, wherein the second electriferous group comprises a group obtained after an amino group reacts with an acidic group.

7. The light emitting panel according to claim 1, wherein the second electriferous group further comprises carbon atoms connecting the polycyclic structure and the second electriferous group, and an R group connected with nitrogen atoms; and
    the R group is one or a combination of followings:
    hydrogen atoms,
    a methyl group, and
    an alkyl group.

8. The light emitting panel according to claim 1, wherein the polycyclic structure is a polycyclic aromatic hydrocarbon comprising a plurality of benzene rings.

9. The light emitting panel according to claim 8, wherein the polycyclic structure is one of followings:

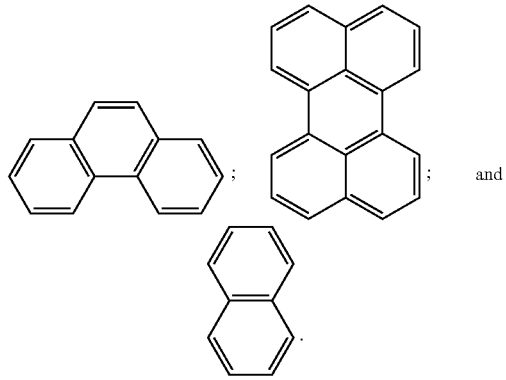

10. The light emitting panel according to claim 1, wherein the interfacial modification layer comprises a following structure:

wherein an R group is one or a combination of followings:
    hydrogen atoms,
    a methyl group, and
    an alkyl group.

11. A display apparatus, comprising the light emitting panel according to claim 1.

12. The light emitting panel according to claim 5, wherein the first electriferous group is —O.
13. The light emitting panel according to claim 6, wherein the second electriferous group is
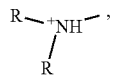
wherein R group is hydrogen atoms.
14. The light emitting panel according to claim 8, wherein the polycyclic structure is
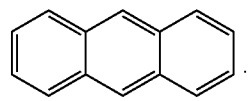 [SMILES: c1ccc2cc3ccccc3cc2c1]
* * * * *